(12) United States Patent
Trzasko et al.

(10) Patent No.: US 11,307,280 B2
(45) Date of Patent: Apr. 19, 2022

(54) METHODS FOR CORRECTING MOTION-ENCODING GRADIENT NONLINEARITIES IN MAGNETIC RESONANCE ELASTOGRAPHY

(71) Applicant: Mayo Foundation For Medical Education and Research, Rochester, MN (US)

(72) Inventors: Joshua D. Trzasko, Rochester, MN (US); Philip A. Araoz, Rochester, MN (US); Matthew A. Bernstein, Rochester, MN (US); Richard L. Ehman, Rochester, MN (US); Arvin Forghanian-Arani, Rochester, MN (US); John Huston, III, Rochester, MN (US); Yunhong Shu, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 0 days.

(21) Appl. No.: 17/059,931

(22) PCT Filed: Jun. 3, 2019

(86) PCT No.: PCT/US2019/035181
§ 371 (c)(1),
(2) Date: Nov. 30, 2020

(87) PCT Pub. No.: WO2019/232522
PCT Pub. Date: Dec. 5, 2019

(65) Prior Publication Data
US 2021/0165065 A1    Jun. 3, 2021

Related U.S. Application Data

(60) Provisional application No. 62/679,200, filed on Jun. 1, 2018.

(51) Int. Cl.
*G01R 33/565* (2006.01)
*G01R 33/563* (2006.01)

(52) U.S. Cl.
CPC ... *G01R 33/56572* (2013.01); *G01R 33/56358* (2013.01)

(58) Field of Classification Search
USPC .......................................................... 324/309
See application file for complete search history.

(56) References Cited

U.S. PATENT DOCUMENTS

| 4,591,789 A | 5/1986 | Glover |
| 2015/0309140 A1* | 10/2015 | Trzasko ........... G01R 33/56358 324/309 |

(Continued)

OTHER PUBLICATIONS

Arani, A. et al. High Resolution 3D Gre Brain MR Elastography is Feasible with a High Performance Compact 3T Scanner. Proceedings of the ISMRM 2017, p. 1367.

(Continued)

*Primary Examiner* — Rodneye E Fuller
(74) *Attorney, Agent, or Firm* — Quarles & Brady LLP (57) ABSTRACT

Described here are systems and methods for correcting motion-encoding gradient nonlinearities in magnetic resonance elastography ("MRE"). In general, the systems and methods described in the present disclosure compute gradient nonlinearity corrected displacement data based on information about the motion-encoding gradients used when acquiring magnetic resonance data.

16 Claims, 4 Drawing Sheets

(56) References Cited

U.S. PATENT DOCUMENTS

2015/0309145 A1 10/2015 Klatt
2021/0124005 A1* 4/2021 Mandava ........... G01R 33/4824

OTHER PUBLICATIONS

Bammer, R., et al. "Analysis and generalized correction of the effect of spatial gradient field distortions in diffusion-weighted imaging." Magnetic Resonance in Medicine: An Official Journal of the International Society for Magnetic Resonance in Medicine 50.3 (2003): 560-569.
Grimm, R. C., et al. Gradient Moment Nulling in MR Elastography of the Liver. Proceedings of the 15th Annual Meeting of ISMRM, Berlin, Germany. 2007.
Hiscox, L. V., et al. "Magnetic resonance elastography (MRE) of the human brain: technique, findings and clinical applications." Physics in Medicine & Biology 61.24 (2016): R401.
International Searching Authority. International Search Report and Written Opinion for application PCT/US2019/035181. Mailed on Sep. 3, 2019. 13 pages.
Klatt, D., et al. Sample interval modulation for the simultaneous acquisition of displacement vector data in magnetic resonance elastography: theory and application. Physics in medicine and biology 58.24 (2013): 8663.
Markl, M., et al. "Generalized reconstruction of phase contrast MRI: analysis and correction of the effect of gradient field distortions." Magnetic Resonance in Medicine: An Official Journal of the International Society for Magnetic Resonance in Medicine 50.4 (2003): 791-801.
Murphy, M. C., et al. "Measuring the characteristic topography of brain stiffness with magnetic resonance elastography." Proceedings of the ISMRM 2013, p. 2422.
Muthupillai, R., et al. "Magnetic resonance elastography by direct visualization of propagating acoustic strain waves." science 269. 5232 (1995): 1854-1857.
Muthupillai, R., et al. Magnetic resonance imaging of transverse acoustic strain waves. Magnetic Resonance in Medicine 36.2 (1996): 266-274.
Oliphant, T. E., et al. Complex-valued stiffness reconstruction for magnetic resonance elastography by algebraic inversion of the differential equation. Magnetic resonance in Medicine 45.2 (2001): 299-310.
Romeo, F. et al. Magnet field profiling: analysis and correcting coil design. Magnetic Resonance in Medicine 1.1 (1984): 44-65.
Tan, E. T., et al. "High slew-rate head-only gradient for improving distortion in echo planar imaging: Preliminary experience." Journal of Magnetic Resonance Imaging 44.3 (2016): 653-664.
Tan, E. T., et al. "Improved correction for gradient nonlinearity effects in diffusion-weighted imaging." Journal of Magnetic Resonance Imaging 38.2 (2013): 448-453.
Tao, A. T., et al. "Improving apparent diffusion coefficient accuracy on a compact 3T MRI scanner using gradient nonlinearity correction." Proceedings of the ISMRM 2017, p. 1396.
Tao, S., et al. "Gradient pre-emphasis to counteract first-order concomitant fields on asymmetric MRI gradient systems." Magnetic resonance in medicine 77.6 (2017): 2250-2262.
Tao, S., et al. Integrated image reconstruction and gradient nonlinearity correction. Magnetic resonance in medicine 74.4 (2015): 1019-1031.
Trzasko, J.D. et al. Motion Encoding Gradient Nonlinearity Correction for Magnetic Resonance Elastography. Proceedings of the International Society for Magnetic Resonance in Medicine, 26th Annual Meeting and Exhibition, Paris, France, Jun. 16-21, 2018, vol. 26, 4202, Jun. 1, 2018, pp. 1-6.
Trzasko, J.D., et al. A Graph Cut Approach to Regularized Harmonic Estimation for Steady-State MR Elastography. Proceedings of the 22nd Annual Meeting of ISMRM, Milan, Italy. 2014. 4268.
Weavers, P. T., et al. "B0 concomitant field compensation for MRI systems employing asymmetric transverse gradient coils." Magnetic resonance in medicine 79.3 (2018): 1538-1544.
Weavers, P. T., et al. "Compact three-tesla magnetic resonance imager with high-performance gradients passes ACR image quality and acoustic noise tests." Medical physics 43.3 (2016): 1259-1264.

* cited by examiner

METHODS FOR CORRECTING MOTION-ENCODING GRADIENT NONLINEARITIES IN MAGNETIC RESONANCE ELASTOGRAPHY

CROSS-REFERENCE TO RELATED APPLICATIONS

This application is a 371 U.S. National Phase application of PCT/US2019/035181, filed Jun. 3, 2019, which claims the benefit of U.S. Provisional Patent Application Ser. No. 62/679,200 filed on Jun. 1, 2018, and entitled "METHODS FOR CORRECTING MOTION-ENCODING GRADIENT NONLINEARITIES IN MAGNETIC RESONANCE ELASTOGRAPHY," which is herein incorporated by reference in its entirety.

STATEMENT REGARDING FEDERALLY SPONSORED RESEARCH

This invention was made with government support under EB010065, HL115144, and EB001981 awarded by the National Institutes of Health. The government has certain rights in the invention.

BACKGROUND

In practice, the gradient magnetic fields produced by an MRI scanner are never truly linear. While this non-ideality is most commonly attributed to inaccuracies in spatial encoding, which causes image geometric distortion, it also impacts the accuracy of the signal generated during gradient-based motion encoding, such as diffusion, phase contrast flow, and elastography. While the effect and correction of nonlinearity-induced motion encoding has been characterized in diffusion, there remains a need for methods that can characterize and correct the effects of gradient nonlinearity on magnetic resonance elastography data.

SUMMARY OF THE DISCLOSURE

The present disclosure addresses the aforementioned drawbacks by providing a method for generating an image that depicts mechanical properties of a subject using a magnetic resonance imaging (MRI) system. Motion-encoded magnetic resonance data are acquired from a subject using an MRI system operating a pulse sequence that applies at least one motion-encoding gradient having gradient nonlinearities. Gradient waveform data comprising gradient waveforms of the at least one motion-encoding gradient, and spatial response function data comprising spatial response functions of gradient coils used to apply the at least one motion-encoding data are both provided to a computer system. Gradient nonlinearity corrected displacement data are computed from the motion-encoded magnetic resonance data using the gradient waveform data and the spatial response function data. An image that depicts mechanical properties of the subject is then generated from the gradient nonlinearity corrected displacement data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for correcting motion-encoding gradient nonlinearities in magnetic resonance elastography ("MRE"). In general, the systems and methods described in the present disclosure compute gradient nonlinearity corrected displacement data based on information about the motion-encoding gradients used when acquiring magnetic resonance data.

In MRE, an external vibration source generates mechanical waves in a tissue that are used to characterize that tissue. The mechanical waves alter the phase of the measurable magnetic resonance signals, and from this phase information the mechanical properties (e.g., Young's modulus, Poisson's ratio, shear modulus, bulk modulus) of the tissue can be determined.

Figure 1:
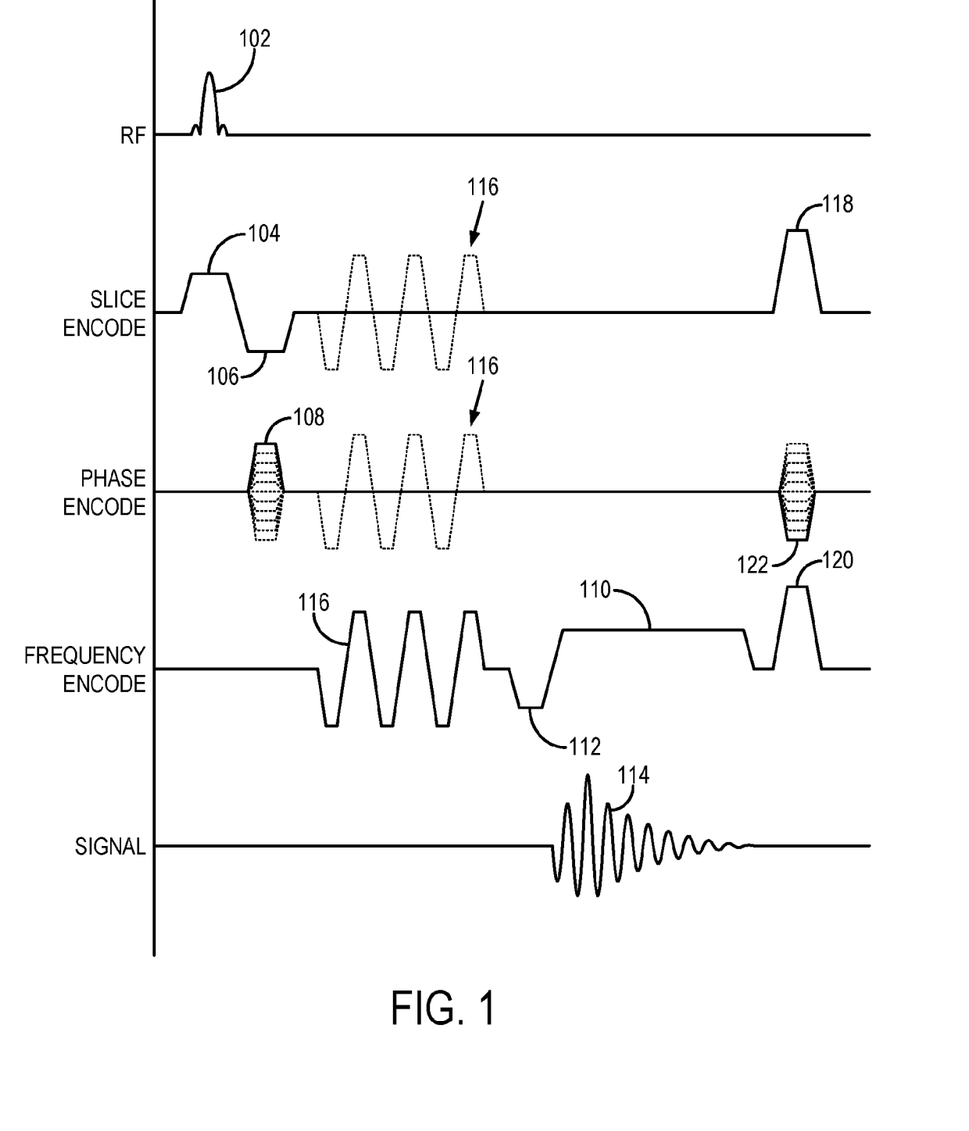
FIG. 1 is an example of a pulse sequence that can be used to acquire motion-encoded magnetic resonance data.

Referring now to FIG. 1, an example of a three-dimensional gradient-recalled echo ("GRE") pulse sequence that may be used to acquire MRE data when practicing some embodiments of the present invention is illustrated. This pulse sequence is capable of acquiring suitable three-dimensional vector wave field information in three motion axes in both breasts simultaneously. Transverse magnetization is produced by an RF excitation pulse 102 that is played out in the presence of a slice-selective gradient 104. To mitigate signal losses resulting from phase dispersions produced by the slice-selective gradient 104, a rephasing lobe 106 is applied after the slice-selective gradient 104. A phase-encoding gradient 108 is applied at an amplitude and polarity determined by the view number of the acquisition, and prior to a readout gradient 110 that includes a prephasing lobe 112. The readout gradient 110 forms a gradient-recalled echo 114 that is sampled by the MRI system to acquire image data.

Following the application of the phase-encoding gradient 108 and before the application of the readout gradient 110, one or more motion-encoding gradients 116 are played out. For example, as illustrated, a motion-encoding gradient 116 is played out along the frequency-encoding direction. The motion-encoding gradient 116 sensitizes the echo signal 114 to motion occurring along the same direction in which the motion-encoding gradient 116 is applied. Additional motion-encoding gradients 116 can also be played out along one or both of the slice-encoding and phase-encoding directions. Combinations of one or more motion-encoding gradients 116 will sensitize the echo signal 114 to motion along different directions defined by the combinations of the motion-encoding gradients 116 along the different gradient axes.

Each motion-encoding gradient 116 is an alternating gradient having a frequency equal to that of a drive signal that drives an MRE driver to produce oscillatory motion in the subject. In some implementations, during the application of the motion-encoding gradients 116 the pulse sequence server of the MRI system produces sync pulses that have the same frequency as, and have a specific phase relationship with respect to, the motion-encoding gradients 116. These sync pulses are used to produce the drive signals for the MRE driver to apply the oscillating stress to the subject.

As noted above, the phase of the echo signal 114 is indicative of the movement of the spins. If the spins are stationary, the phase of the echo signal 114 is not altered by the motion-encoding gradients 116 whereas spins moving along the motion-encoding direction will accumulate a phase proportional to their velocity. Spins that move in synchronism and in phase with the motion-encoding gradients 116 will accumulate maximum phase of one polarity, and those that move in synchronism, but 180 degrees out of phase with the motion-encoding gradients 116 will accumulate maximum phase of the opposite polarity. The phase of the acquired echo signal 114 is, thus, affected by the "synchronous" movement of spins along the motion-encoding direction.

The pulse sequence is concluded with the application of spoiler gradient pulses 118 and 120 along slice-encoding direction and frequency-encoding direction, respectively. Additionally, a rephasing gradient 122 is applied along the phase-encoding direction. As is well known in the art, this rephasing gradient 122 has the same size and shape, but opposite polarity, of the phase-encoding gradient 108. The pulse sequence is repeated a number of times with the phase-encoding gradient 108 being stepped through successive values in each repetition to acquire a data set as an array of complex echo signal samples.

It will be appreciated by those skilled in the art that the pulse sequence described in FIG. 1 is but one example of an MRE pulse sequence, and that other MRE pulse sequences can be similarly implemented with the methods described in the present disclosure.

As noted above, the motion-encoding gradients 116 produced by the MRI scanner are not truly linear. The phase accrual of spins moving through a nonlinear motion-encoding gradient is not spatiotemporally separable, and thus phase encoded wave harmonics are, for practical purposes, not directly accessible from the phase of the magnetization signal when nonlinear gradients are utilized. If these gradient nonlinearity effects are ignored, the corresponding estimates of the wave harmonics and mechanical properties will be biased.

The systems and methods described in the present disclosure provide for a phase correction based on the nonlinearity of the motion-encoding gradients used to acquire magnetic resonance signals, such that more accurate mechanical properties can be computed from images reconstructed from the acquired data. In this manner, the systems and methods descried in the present disclosure can improve the functioning of the MRI scanner by enabling nonlinear motion-encoding gradients to be utilized while still being able to compute accurate mechanical properties.

In a standard magnetic resonance imaging ("MRI") experiment, the (z-oriented component of the) magnetic field incident to the object of interest can be described as the superposition of the spatiotemporally static main field ($B_0$) and those magnetic fields generated by each of the gradient coils:

$$B(\vec{r},t)=B_0+B_X(\vec{r},t)+B_Y(\vec{r},t)+B_Z(\vec{r},t) \quad (1);$$

where $\vec{r}=x\vec{i}+y\vec{j}+z\vec{k}$, and where $B_X$, $B_Y$, and $B_Z$ denote the spatiotemporally varying fields generated by the X, Y, and Z gradient coils, respectively, to facilitate spatial encoding of the object magnetization signal. It is typically presumed that the application of a time-varying electrical current (i.e., "waveform") to a gradient coil will impart a proportional uniform scaling of its spatial response function. Mathematically, this asserts that the field generated by an arbitrary gradient coil can be decomposed as, $$B_D(\vec{r},t)=S_D(\vec{r})G_D(t) \quad (2);$$

where $S_D$ is the gradient coil's spatial response function and $G_D$ is the (appropriately scaled) gradient waveform applied to it. Under this presumption, Eqn. (1) can be equivalently stated as, $$B(\vec{r},t)=B_0+S_X(\vec{r})G_X(t)+S_Y(\vec{r})G_Y(t)+S_Z(\vec{r})G_Z(t) \quad (3).$$

In conventional Fourier transform imaging, it can be presumed that each of the three gradient coils induces a linear variation across its associated dimension, i.e., $S_X(\vec{r})=x$, $S_Y(\vec{r})=y$, and $S_Z(\vec{r})=z$. However, due to various engineering and physiological limitations, in practice the field variations induced by gradient coils are neither exactly linear nor confined to their associated directionality. In other words, when a user activates a gradient coil to induce a specific linear field across a particular dimension (e.g., the X dimension), the true generated field variations will exhibit both spatial dependence (with the deviation from linearity increasing with distance from isocenter) and components within all three spatial directions. In practice, the spatial response of a gradient coil is typically modeled using a low-order spherical harmonic expansion, such as, $$S_D(\vec{r}) \approx \sum_{n=0}^{N}\sum_{m=0}^{n} \rho^n(\vec{r}) P_{nm}(\cos(\theta(\vec{r})))[A_{D,nm}\cos(m\phi(\vec{r}))+B_{D,nm}\sin(m\phi(\vec{r}))]; \quad (4)$$

where N is the model order, $\{\rho(\vec{r}),\theta(\vec{r}),\phi(\vec{r})\}$ denotes the polar coordinate transformation of $\vec{r}$, $P_{nm}(\bullet)$ is the associated Legendre polynomial of order n and degree m, and $A_{D,nm}$ and $B_{D,nm}$ are coil-specific model coefficients.

During an MRI experiment, the magnetic field does not explicitly present in the measured signal; instead, the cumulative history of the field defines the phase of the (causal) integral transform model, relating it to the magnetization of the object of interest. Mathematically, this relationship can be expressed as follows:

$$g[n] \int_\Omega m_0(r) e^{-j\gamma \int_0^{t[n]} B(\vec{r},\tau)d\tau} d\vec{r}; \quad (5)$$

where $\gamma$ is the gyromagnetic ratio, $j=\sqrt{-1}$, $\Omega$ is the field of excitation ("FOX"), and $t[n]$ denotes the elapsed time between (the midpoint of) RF-excitation and the acquisition of sample, n. Due to the various preparatory RF and gradient pulses that may be applied before the readout phase of the pulse sequence, typically t[0]>0. As $B_0$ is presumed to be a priori known and spatially invariant, its induced phase is typically demodulated from the measured MRI signal prior to any reconstruction or post-processing operations are performed, yielding, $$h[n] = e^{j\gamma B_0 t[n]} g[n] = \int_\Omega m_0(r) e^{-j\gamma \int_0^{t[n]} B(\vec{r},\tau) d\tau} d\vec{r}. \tag{6}$$

Letting $\Delta \in [0,t[0]]$ denote the (relative) start time of the readout stage of the pulse sequence (including pre-winding), the demodulated signal in Eqn. (6) can be further decomposed as, $$h[n] \int_\Omega \hat{m}_0(r) e^{-j\gamma \int_0^{t[n]} B(\vec{r},\tau) d\tau} d\vec{r}; \tag{7}$$

where the derived magnetization signal, $$\hat{m}_0(\vec{r}) = m_0(\vec{r}) e^{-j\gamma \int_0^\Delta (B(\vec{r},\tau) - B_0) d\tau} = m_0(\vec{r}) e^{-j\phi(\vec{r})}; \tag{8}$$

is spatially modulated by the phase accrued during the preparation stage of the pulse sequence, such as the application of motion-encoding gradients ("MEG") in velocimetry or elastography. Noting the spatiotemporal separability of the magnetic field as specified in Eqn. (3), the encoding phase of the integral transform in Eqn. (6) can be restated as, $$\gamma \int_\Delta^{t[n]} (B(\vec{r},\tau) - B_0) d\tau = S_X(\vec{r}) k_X(t[n]) + S_Y(\vec{r}) k_Y(t[n]) + S_Z(\vec{r}) k_Z(t[n]) \tag{9}$$
$$= k(t[n])^T S(\vec{r});$$

where the spatial frequency (i.e., k-space) indices are as traditionally defined, such as, $$k_X(t[n]) = \gamma \int_\Delta^{t[n]} G_X(\tau) d\tau; \tag{10}$$

$$k_Y(t[n]) = \gamma \int_\Delta^{t[n]} G_Y(\tau) d\tau; \tag{11}$$

$$k_Z(t[n]) = \gamma \int_\Delta^{t[n]} G_Z(\tau) d\tau. \tag{12}$$

Correspondingly, Eqn. (7) can be restated as, $$h[n] = \int_\Omega \hat{m}_0(\vec{r}) e^{-jk(t[n])^T S(\vec{r})} d\vec{r}. \tag{13}$$

When $S(\vec{r})$ corresponds to the per-dimension linear spatial response, Eqn. (13) resorts to a standard Fourier transform model. In the more practical scenario where $S(x,y,z)$ defines a nonlinear spatial mapping, then the magnetization signal, $\hat{m}_0$, can be estimated by solving an inverse problem constructed directly from Eqn. (13), by applying an inverse Fourier transform to Eqn. (13) and subsequently interpolating the resulting image volume onto a new coordinate set defined by $S(\vec{r})$, or using another appropriate method. In any case, a geometrically accurate estimate of $\hat{m}_0$ is obtained, and it remains to determine both $\hat{m}_0$ and its modulating phase signal. As one example, the phase encoded quantity of interest can be directly estimated from raw k-space data utilizing the relationship defined in Eqn. (13).

In many applications, such as velocimetry and elastography, the estimated magnetization signal $\hat{m}_0$ is not of primary interest; rather, the phase of this signal, which accrues via application of motion-encoding gradients during time interval $t \in [0, \Delta]$, is the quantity of interest. In such applications, spins may be moving coherently (e.g., due to blood flow or external mechanical vibration) during the time that MEGs are active. If the MEGs are synchronized to the moments or periodicity of this motion, then their motion through the spatiotemporally-varying magnetic field must be accounted for when determining instantaneous phase accrual at a given spatial point in the observed magnetization signal.

The instantaneous phase of the derived magnetization signal in Eqn. (8), under the allowance of spin motion during MEG application is, $$\phi(\vec{r}) = -\gamma \int_0^\Delta \left( \begin{array}{c} S_X(\vec{\mu}(\vec{r},\tau)) G_X(\tau) + S_Y(\vec{\mu}(\vec{r},\tau)) G_Y(\tau) + \\ S_Z(\vec{\mu}(\vec{r},\tau)) G_Z(\tau) \end{array} \right) d\tau \tag{14}$$
$$= -\gamma \int_0^\Delta G(\tau)^T S(\vec{\mu}(\vec{r},\tau)) d\tau;$$

where the causal functional $\vec{\mu}(\vec{r},\tau)$ indicates the position at time $\tau$ of the spin ensemble that is at position $\vec{r}$ at the commencement of readout (i.e., $t=\Delta$). For example, in velocimetry, it is commonly assumed that, $$\vec{\mu}(\vec{r},\tau) = \vec{\mu}(\vec{r},0) + \tau \vec{v}(\vec{r}) \tag{15};$$

where $\vec{v}(\vec{r})$ denotes the velocity of blood flow. In MR elastography, it can be generally assumed that, $$\vec{\mu}(\vec{r},\tau) = \vec{\mu}(\vec{r},0) + Re\{\vec{\eta}_0(\vec{r}) e^{j(\zeta(\vec{r}) - \omega t + \alpha)}\} \tag{16};$$

where $\hat{\eta}_0(\vec{r})$ is peak wave displacement, $\zeta(\vec{r})$ is instantaneous (complex) spatial frequency of the wave, $\omega$ is the external mechanical driving frequency, and $\alpha$ is the nominal wave delay. For monochromatic wave vector $\vec{k}$ plane waves, $$\zeta(\vec{r}) = \vec{k} \cdot \vec{r} \tag{17}.$$

From Eqn. (14), it can be seen that the phase accrual of a spin moving through a nonlinear gradient field is not spatiotemporally separable. Consequently, and unlike within the linear encoding regime, phase encoded quantities such as blood velocity or wave harmonics are not directly accessible from the phase of the magnetization signal in Eqn. (8) when nonlinear gradients are utilized (i.e., for all practical cases). Moreover, if gradient nonlinearity effects are ignored, the corresponding estimates of such quantities will be (potentially significantly) biased. To facilitate numerical accessibility while at least partially accounting for gradient nonlinearity effects, the gradient coil spatial response functional in Eqn. (14) may be replaced with its first-order Taylor expansion about a position vector, $\vec{r}_0$:

$$S(\vec{\mu}(\vec{r},\tau)) \approx S(\vec{r}_0) + J_S(\vec{r}_0)(\vec{\mu}(\vec{r},\tau) - \vec{r}_0) \tag{18}$$

where the Jacobian matrix, $$J_S(\vec{r}_0) = \begin{bmatrix} \frac{\partial S_X}{\partial x}(\vec{r}_0) & \frac{\partial S_X}{\partial y}(\vec{r}_0) & \frac{\partial S_X}{\partial z}(\vec{r}_0) \\ \frac{\partial S_X}{\partial y}(\vec{r}_0) & \frac{\partial S_Y}{\partial y}(\vec{r}_0) & \frac{\partial S_Y}{\partial z}(\vec{r}_0) \\ \frac{\partial S_X}{\partial z}(\vec{r}_0) & \frac{\partial S_Z}{\partial y}(\vec{r}_0) & \frac{\partial S_Z}{\partial z}(\vec{r}_0) \end{bmatrix}. \quad (19)$$

In other embodiments of the methods described in the present disclosure, alternative expansions (e.g., a Chebyshev polynomial) of $S(\vec{\mu}(\vec{r},\tau))$ can be employed for this same purpose.

Under Eqn. (18), Eqn. (14) resorts to, $$\phi(\vec{r}) \approx -\gamma \int_0^\Delta G(\tau)^T J_S(\vec{r}_0)\vec{\mu}(\vec{r},\tau)d\tau - \gamma \int_0^\Delta G(\tau)^T(S(\vec{r}_0) - J_S(\vec{r}_0)\vec{r}_0)d\tau. \quad (20)$$

Only the gradient coil current signal, $G(\tau)$, in the second integral term of the above equation is temporally dependent, which suggests that this term will not generate any net phase accrual when zero moment nulled preparation gradients (e.g., bipolar gradients) are utilized. For example, in velocimetry with the assumption of instantaneous linear flow, Eqn. (20) can be simplified to, $$\phi(\vec{r}) \approx -\gamma \left(\int_0^\Delta \tau G(\tau)d\tau\right)^T J_S(\vec{r}_0)\vec{v}(\vec{r}) = -\gamma M_{(1)}^T J_S(\vec{r}_0)\vec{v}(\vec{r}); \quad (21)$$

where $M_{(1)}$ denotes the first gradient moment over the preparation interval $t \in [0,\Delta]$. In this model, the field differential, $J_S(\cdot)$, may be evaluated at any spatial location instead of simply at the readout spin position, $\vec{r}$. While this relaxation may facilitate no practical differences for restricted motion applications like elastography, where spins have the same nominal and mean temporal position, in transient motion applications like flow it may be advantageous to evaluate the field differential at a spin's mean temporal position, which, depending on its velocity, can significantly differ from its readout position.

In most motion encoded MRI applications, multiple scans are performed each utilizing a slightly different gradient parameterization, e.g., primary directional sensitivity. Considering the velocimetry example in Eqn. (21), if N such scans are performed then the length-N phase vector at position $\vec{r}$ can be expressed as, $$\Phi(\vec{r}) = \begin{bmatrix} \phi_0(\vec{r}) \\ \phi_1(\vec{r}) \\ \vdots \\ \phi_{N-1}(\vec{r}) \end{bmatrix} \approx -\gamma \begin{bmatrix} M_{(1),0}^T \\ M_{(1),1}^T \\ \vdots \\ M_{(1),N-1}^T \end{bmatrix} J_S(\vec{r}_0)\vec{v}(\vec{r}); \quad (22)$$

where $M_{(1),n}$ denotes the first gradient moment of the nth scan. Presuming that the imaging protocol prescribes a full rank encoding system, the gradient nonlinearity corrected velocity vector can be estimated by (left) pseudo-inversion of Eqn. (22), $$\vec{v}(\vec{r}) \approx -\frac{1}{\gamma}\left(\begin{bmatrix} M_{(1),0}^T \\ M_{(1),1}^T \\ \vdots \\ M_{(1),N-1}^T \end{bmatrix} J_S(\vec{r}_0)\right)^\dagger \Phi(\vec{r}). \quad (23)$$

Like velocimetry, MRE utilizes cyclic zero moment nulled encoding gradients to accrue signal phase proportional to the externally driven harmonic motion of spins. In MRE, spin motion is presumed to be harmonic, such that $\vec{\mu}(\vec{r},\tau) = \vec{\mu}(\vec{r},0) + \text{Re}\{\vec{\eta}_0(\vec{r})e^{j(\zeta(\vec{r})-\omega\tau+\alpha)}\}$. Under this assumption, and ignoring its zero gradient moment terms, Eqn. (20) resorts to, $$\phi(\vec{r}) \approx -\gamma \int_0^\Delta G(\tau)^T J_S(\vec{r}_0)(\vec{\mu}(\vec{r},0) + \text{Re}\{\vec{\eta}_0(\vec{r})e^{j(\zeta(\vec{r})-\omega\tau+\alpha)}\})d\tau = \quad (24)$$

$$-\gamma\text{Re}\left\{\left(\int_0^\Delta e^{-j\omega\tau}G(\tau)d\tau\right)^T J_S(\vec{r}_0)\vec{\eta}_0(\vec{r})e^{j(\zeta(\vec{r})+\alpha)}\right\} =$$

$$-\gamma\text{Re}\{F_G(\omega)^T J_S(\vec{r}_0)\vec{\eta}_0(\vec{r})e^{j(\zeta(\vec{r})+\alpha)}\} =$$

$$-\gamma\begin{bmatrix} +\text{Re}\{e^{(j\alpha)}F_G(\omega)\} \\ -\text{Im}\{e^{(j\alpha)}F_G(\omega)\} \end{bmatrix}^T (I_{2\times 2} \otimes J_S(\vec{r}_0))\begin{bmatrix} \vec{\eta}_0(\vec{r})\cos(\zeta(\vec{r})) \\ \vec{\eta}_0(\vec{r})\sin(\zeta(\vec{r})) \end{bmatrix} =$$

$$-\gamma A^T (I_{2\times 2} \otimes J_S(\vec{r}_0))\begin{bmatrix} \vec{\eta}_0(\vec{r})\cos(\zeta(\vec{r})) \\ \vec{\eta}_0(\vec{r})\sin(\zeta(\vec{r})) \end{bmatrix};$$

where $F_G(\omega)$ denotes the Fourier transform of the MRE MEG evaluated at the mechanical driving frequency, $\omega$; $\otimes$ is Kronecker's product; and $I_{2\times 2}$ is the 2×2 identity operator. The operator, A, can be considered analogous to the first gradient moment, $M_{(1)}$, in the velocimetry example described above, and from Eqn. (24) can be expressed as, $$A = \begin{bmatrix} +\text{Re}\{e^{(j\alpha)}F_G(\omega)\} \\ -\text{Im}\{e^{(j\alpha)}F_G(\omega)\} \end{bmatrix}. \quad (25)$$

An MRE acquisition protocol, like velocimetry, typically includes multiple scans performed using different gradient encoding directions, as well as different MEG and/or mechanical motion start times (i.e., phase offsets). Mirroring Eqn. (22), if N such MRE scans are performed then the length-N phase vector at position $\vec{r}$ can be expressed as, $$\Phi(\vec{r}) = \begin{bmatrix} \phi_0(\vec{r}) \\ \phi_1(\vec{r}) \\ \vdots \\ \phi_{N-1}(\vec{r}) \end{bmatrix} \approx -\gamma \begin{bmatrix} A_0^T \\ A_1^T \\ \vdots \\ A_{N-1}^T \end{bmatrix} (I_{2\times 2} \otimes J_S(\vec{r}_0))\begin{bmatrix} \vec{\eta}_0(\vec{r})\cos(\zeta(\vec{r})) \\ \vec{\eta}_0(\vec{r})\sin(\zeta(\vec{r})) \end{bmatrix}; \quad (26)$$

where $A_n$ denotes the operator associated with the nth scan. Again presuming that the imaging protocol prescribes a full rank encoding system, the gradient nonlinearity corrected harmonic displacement vector can be estimated by (left) pseudo-inversion of Eqn. (26), $$\begin{bmatrix} \vec{\eta}_0(\vec{r})\cos(\zeta(\vec{r})) \\ \vec{\eta}_0(\vec{r})\sin(\zeta(\vec{r})) \end{bmatrix} \approx -\frac{1}{\gamma} \left( \begin{bmatrix} A_0^T \\ A_1^T \\ \vdots \\ A_{N-1}^T \end{bmatrix} (I_{2\times 2} \otimes J_S(\vec{r}_0)) \right)^\dagger \Phi(\tau). \quad (27)$$

Note that the above correction scheme can be applied to any MRE encoding strategy, including monodirectional, Hadamard/tetrahedral, and sample interval modulation ("SLIM"), as well as those that employ first gradient moment nulled MEGs. Noting that the spin motion vector in MRE is zero mean, it is generally recommended that the Taylor series expansion be performed about $\vec{r}_0 = \vec{r}$. In lieu of utilizing Eqn. (27) to estimate the harmonic vector, an alternative strategy would be to embed Eqn. (26) within an iterative model-based estimation framework, which may further improve image quality.

The MRE gradient nonlinearity correction model in Eqn. (27) targets direct estimation of the (complex) displacement harmonic from a vector of phase values. However, if the scan set can be factored into subsets whose constituent MEGs differ only in amplitude, then gradient nonlinearity correction can equivalently be performed on individual displacement images prior to harmonic estimation. For example, if motion-synchronized sinusoidal (or pseudo-sinusoidal trapezoidal) MEGs are applied for C periods starting at time $t_0$, $$G(t) = \begin{cases} G_0 \cos(\omega t) & t \in \left[t_0, t_0 + \frac{2\pi}{\omega}C\right] \subseteq [0, \Delta] \\ 0 & \text{else} \end{cases} ; \quad (28)$$

and thus $$F_G(\omega) = \int_0^\Delta e^{-j\omega\tau} G(\tau)d\tau = G_0 e^{-j\omega t_0} \frac{\pi C}{\omega}. \quad (29)$$

Recalling Eqn. (24), the phase of an image generated using the MEG model in Eqn. (28) can be given by, $$\phi(\vec{r}) \approx -\frac{\gamma \pi C}{\omega} G_0^T J_S(\vec{r}_0) \cos(\zeta(\vec{r}) + \alpha - \omega t_0). \quad (30)$$

Moreover, if the MEG start time is defined as, $$t_0 = \frac{1}{\omega}\left(\frac{2\pi n}{N} + \alpha\right); \quad (31)$$

where $n \in [0, N) \subset \mathbb{Z}^+$, or the external mechanical motion initial phase is defined as, $$\alpha = \omega t_0 + \frac{2\pi(pN - n)}{N}; \quad (32)$$

where $p \in \mathbb{Z}^+$, then $$\phi(\vec{r}) \approx -\frac{\gamma \pi C}{\omega} G_0^T J_S(\vec{r}_0) \vec{\eta}_0(\vec{r}) \cos\left(\zeta(\vec{r}) - \frac{2\pi n}{N}\right) = -\frac{\gamma \pi C}{\omega} G_0^T J_S(\vec{r}_0) \vec{\delta}(\vec{r}, n); \quad (33)$$

where $\vec{\delta}(\vec{r}, n)$ denotes the spin motion displacement vector at position $\vec{r}$ and phase offset n (out of N). Under the presumption of Eqn. (28), the phase vector in Eqn. (26) can reduce to, $$\Phi(\vec{r}) \approx -\frac{\gamma \pi C}{\omega} \begin{bmatrix} G_{0,0}^T \\ G_{0,1}^T \\ \vdots \\ G_{0,N-1}^T \end{bmatrix} J_S(\vec{r}_0) \vec{\delta}(\vec{r}, n); \quad (34)$$

where $G_{0,n}$ denotes the gradient amplitude vector associated with the nth scan.

Again presuming that the imaging protocol prescribes a full rank encoding system, the gradient nonlinearity corrected harmonic displacement vector can be estimated by (left) pseudo-inversion of Eqn. (26), $$\vec{\delta}(\vec{r}, n) \approx -\frac{\gamma \pi C}{\omega} \left( \begin{bmatrix} G_{0,0}^T \\ G_{0,1}^T \\ \vdots \\ G_{0,N-1}^T \end{bmatrix} J_S(\vec{r}_0) \right)^\dagger \Phi(\vec{r}); \quad (35)$$

Moreover, for uniform monodirectional excitation, N=3 and each gradient amplitude vector is simply a scaled standard basis vector, $$G_{0,n} = \|G_{0,n}\|_2 e_n = \|G_{0,\cdot}\|_2 \quad (36).$$

In this case, Eqn. (35) can be further simplified to, $$\vec{\delta}(\vec{r}, n) \approx -\frac{\omega}{\gamma \pi C \|G_{0,\cdot}\|_2} J_S(\vec{r}_0)^\dagger \Phi(\vec{r}); \quad (37)$$

which asserts that the MRE displacement vector can be directly corrected. From the algebraic structure of Eqn. (37), this correction can also be directly applied to phase difference as well, in the event that the latter strategy is employed to eliminate the presence of background field contributions (e.g., from susceptibility) to the displacement estimates.

Figure 2:
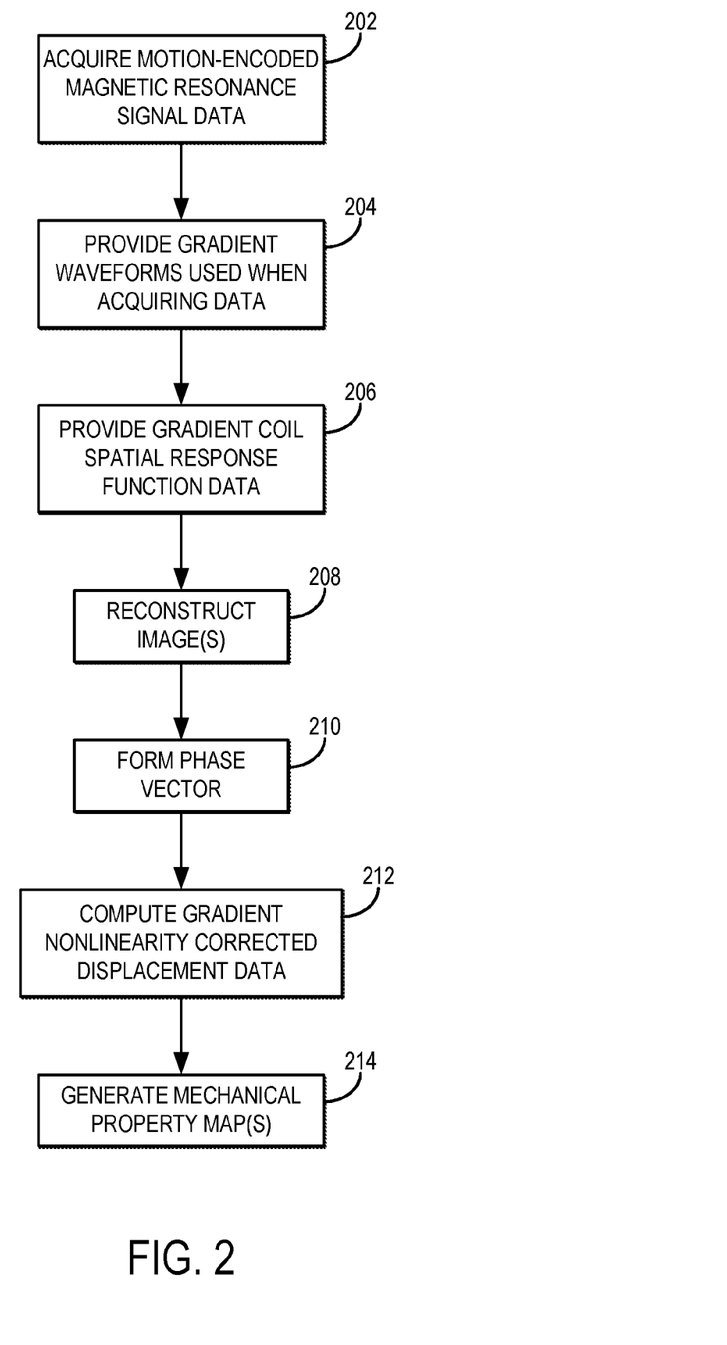
FIG. 2 is a flowchart setting forth the steps of an example method for generating gradient nonlinearity corrected displacement data, from which maps of mechanical properties can be generated.

Referring now to FIG. 2, a flowchart is illustrated as setting forth the steps of an example method for generating gradient nonlinearity corrected estimates of displacement data from data acquired using an MRE scan.

The method includes acquiring magnetic resonance data from a subject using an MRI system, or otherwise accessing previously acquired magnetic resonance data, as indicated at step 202. In particular, the magnetic resonance data are motion-encoded data that are acquired using a pulse sequence that implements one or more motion-encoding gradients to sensitize magnetization to motion. Although elastography is provided as an example, the motion-encoded magnetic resonance data can also be velocimetry data, as mentioned above. The magnetic resonance data may include data acquired for a plurality of different motion-encoding gradient directions, such that motion along different directions can be imaged; may also include data acquired for both positive and negative polarity motion-encoding gradients, such that phase difference images can be generated; and may also include data acquired using a number of different phase offsets, such that images of propagating mechanical waves can be generated.

The gradient waveforms used to generate the motion-encoding gradients are provided to a computer system, as indicated at step 204. Providing the gradient waveforms can include, for instance, retrieving the gradient waveforms from the MRI system based on a query from the computer system. The computer system may form a part of the MRI system (e.g., an operator or networked workstation), or may be a remote computer system. The spatial response functions of the gradient coils used to generate the motion-encoding gradients are also provided to a computer system, as indicated at step 206. Providing the gradient coil spatial response functions can include, for instance, retrieving the spatial response functions from the MRI system based on a query from the computer system.

The magnetic resonance data are also provided to the computer system, and images are reconstructed from the magnetic resonance data using the computer system, as indicated at step 208. This image reconstruction can be a conventional Fourier transform-based image reconstruction, an iterative image reconstruction, or any other suitable reconstruction algorithm.

The phase information from the reconstructed images is stored in a phase vector, as indicated at step 210. The phase information is then used together with the gradient waveforms and the spatial response function data to estimate displacement data that has been corrected for phase errors attributable to nonlinearities in the motion-encoding gradients used when acquiring the magnetic resonance data, as indicated at step 212. In some implementations, the phase vector, gradient waveforms, and spatial response function data can be applied to Eqn. (27) to estimate the displacement data as a gradient nonlinearity corrected harmonic displacement vector. In some other implementations, the gradient nonlinearity correction can be performed on individual displacement images prior to harmonic estimation. For example, Eqn. (35) or Eqn. (37) could be used in these instances.

Based on the gradient nonlinearity corrected displacement data, mechanical properties of the tissue in the subject can be estimated, as indicated at step 214. As noted above, the mechanical properties could include, but are not limited to, stiffness, storage modulus, loss modulus, damping ratio, poroelastic parameters, and so on. The estimated mechanical properties can be stored for later use, and can also be arranged in parameter maps (i.e., images) that depict the spatial distribution of the mechanical properties in the subject.

Figure 3:
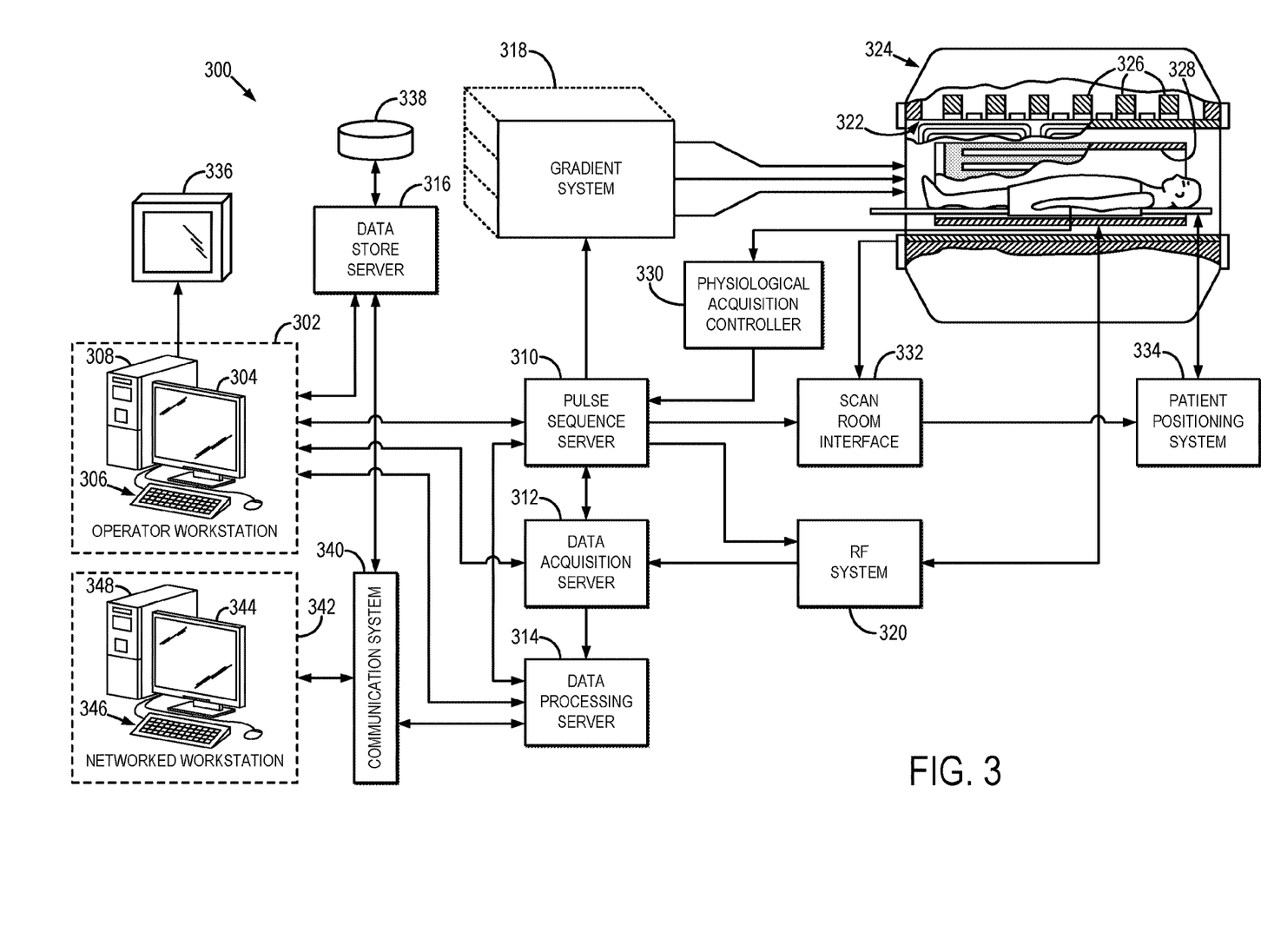
FIG. 3 is a block diagram of an example magnetic resonance imaging ("MRI") system that can implement the methods described in the present disclosure.

Referring particularly now to FIG. 3, an example of an MRI system 300 that can implement the methods described here is illustrated. The MRI system 300 includes an operator workstation 302 that may include a display 304, one or more input devices 306 (e.g., a keyboard, a mouse), and a processor 308. The processor 308 may include a commercially available programmable machine running a commercially available operating system. The operator workstation 302 provides an operator interface that facilitates entering scan parameters into the MRI system 300. The operator workstation 302 may be coupled to different servers, including, for example, a pulse sequence server 310, a data acquisition server 312, a data processing server 314, and a data store server 316. The operator workstation 302 and the servers 310, 312, 314, and 316 may be connected via a communication system 340, which may include wired or wireless network connections.

The pulse sequence server 310 functions in response to instructions provided by the operator workstation 302 to operate a gradient system 318 and a radiofrequency ("RF") system 320. Gradient waveforms for performing a prescribed scan are produced and applied to the gradient system 318, which then excites gradient coils in an assembly 322 to produce the magnetic field gradients $G_x$, $G_y$, and $G_z$ that are used for spatially encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil to perform the prescribed magnetic resonance pulse sequence. Responsive magnetic resonance signals detected by the RF coil 328, or a separate local coil, are received by the RF system 320. The responsive magnetic resonance signals may be amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the prescribed scan and direction from the pulse sequence server 310 to produce RF pulses of the desired frequency, phase, and pulse amplitude waveform. The generated RF pulses may be applied to the whole-body RF coil 328 or to one or more local coils or coil arrays.

The RF system 320 also includes one or more RF receiver channels. An RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (38);$$

and the phase of the received magnetic resonance signal may also be determined according to the following relationship:

$$\varphi = \tan^{1}\left(\frac{Q}{I}\right). \qquad (39)$$

The pulse sequence server 310 may receive patient data from a physiological acquisition controller 330. By way of example, the physiological acquisition controller 330 may receive signals from a number of different sensors connected to the patient, including electrocardiograph ("ECG") signals from electrodes, or respiratory signals from a respiratory bellows or other respiratory monitoring devices. These signals may be used by the pulse sequence server 310 to synchronize, or "gate," the performance of the scan with the subject's heart beat or respiration.

The pulse sequence server 310 may also connect to a scan room interface circuit 332 that receives signals from various sensors associated with the condition of the patient and the magnet system. Through the scan room interface circuit 332, a patient positioning system 334 can receive commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, so that data is not lost by data overrun. In some scans, the data acquisition server 312 passes the acquired magnetic resonance data to the data processor server 314. In scans that require information derived from acquired magnetic resonance data to control the further performance of the scan, the data acquisition server 312 may be programmed to produce such information and convey it to the pulse sequence server 310. For example, during pre-scans, magnetic resonance data may be acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also process magnetic resonance signals used to detect the arrival of a contrast agent in a magnetic resonance angiography ("MRA") scan. For example, the data acquisition server 312 may acquire magnetic resonance data and processes it in real-time to produce information that is used to control the scan.

The data processing server 314 receives magnetic resonance data from the data acquisition server 312 and processes the magnetic resonance data in accordance with instructions provided by the operator workstation 302. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 314 are conveyed back to the operator workstation 302 for storage. Real-time images may be stored in a data base memory cache, from which they may be output to operator display 302 or a display 336. Batch mode images or selected real time images may be stored in a host database on disc storage 338. When such images have been reconstructed and transferred to storage, the data processing server 314 may notify the data store server 316 on the operator workstation 302. The operator workstation 302 may be used by an operator to archive the images, produce films, or send the images via a network to other facilities.

The MRI system 300 may also include one or more networked workstations 342. For example, a networked workstation 342 may include a display 344, one or more input devices 346 (e.g., a keyboard, a mouse), and a processor 348. The networked workstation 342 may be located within the same facility as the operator workstation 302, or in a different facility, such as a different healthcare institution or clinic.

The networked workstation 342 may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342.

Figure 4:
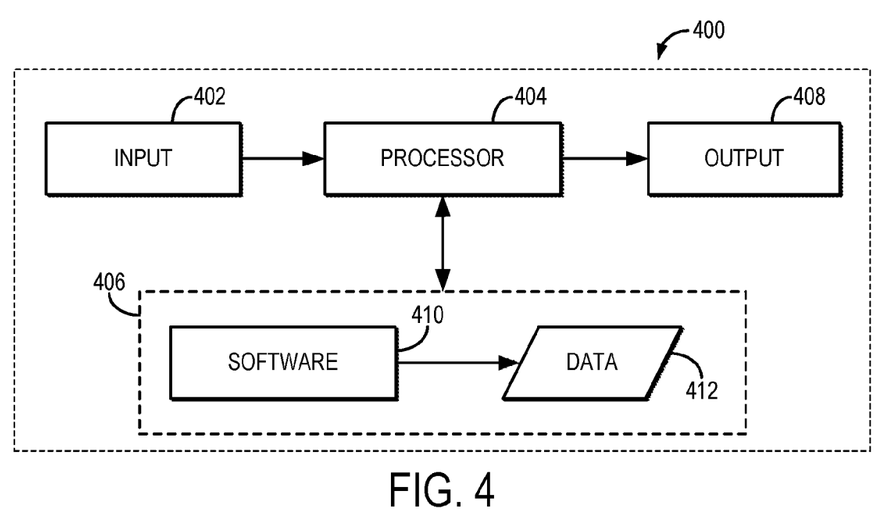
FIG. 4 is a block diagram of an example computer system that can implement the methods described in the present disclosure.

Referring now to FIG. 4, a block diagram of an example of a computer system 400 that can perform the methods described in the present disclosure is shown. The computer system 400 generally includes an input 402, at least one hardware processor 404, a memory 406, and an output 408. Thus, the computer system 400 is generally implemented with a hardware processor 404 and a memory 406.

In some embodiments, the computer system 400 can be a workstation, a notebook computer, a tablet device, a mobile device, a multimedia device, a network server, a mainframe, one or more controllers, one or more microcontrollers, or any other general-purpose or application-specific computing device.

The computer system 400 may operate autonomously or semi-autonomously, or may read executable software instructions from the memory 406 or a computer-readable medium (e.g., a hard drive, a CD-ROM, flash memory), or may receive instructions via the input 402 from a user, or any another source logically connected to a computer or device, such as another networked computer or server. Thus, in some embodiments, the computer system 400 can also include any suitable device for reading computer-readable storage media.

In general, the computer system 400 is programmed or otherwise configured to implement the methods and algorithms described in the present disclosure. For instance, the computer system 400 can be programmed to implement gradient nonlinearity correction algorithms, such as those described above, to generate mechanical property maps from gradient nonlinearity-corrected displacement data.

The input 402 may take any suitable shape or form, as desired, for operation of the computer system 400, including the ability for selecting, entering, or otherwise specifying parameters consistent with performing tasks, processing data, or operating the computer system 400. In some aspects, the input 402 may be configured to receive data, such as gradient waveform data, gradient coil spatial response data, and magnetic resonance signal data acquired with an MRI system. Such data may be processed as described above to reconstruct images, compute gradient nonlinearity-corrected displacement data, and generate mechanical property maps. In addition, the input 402 may also be configured to receive any other data or information considered useful for implementing the methods described above.

Among the processing tasks for operating the computer system 400, the one or more hardware processors 404 may also be configured to carry out any number of post-processing steps on data received by way of the input 402.

The memory 406 may contain software 410 and data 412, such as data acquired with an MRI system, and may be configured for storage and retrieval of processed information, instructions, and data to be processed by the one or more hardware processors 404. In some aspects, the software 410 may contain instructions directed to computing gradient nonlinearity-corrected displacement data and mechanical properties therefrom.

In addition, the output 408 may take any shape or form, as desired, and may be configured for displaying reconstructed images and mechanical property maps, in addition to other desired information.

The present disclosure has described one or more preferred embodiments, and it should be appreciated that many equivalents, alternatives, variations, and modifications, aside from those expressly stated, are possible and within the scope of the invention.

The invention claimed is:

1. A method for generating an image that depicts mechanical properties of a subject using a magnetic resonance imaging (MRI) system, the method comprising:
   (a) acquiring motion-encoded magnetic resonance data from a subject using an MRI system operating a pulse sequence that applies at least one motion-encoding gradient having gradient nonlinearities;
   (b) providing to a computer system:
      gradient waveform data comprising gradient waveforms of the at least one motion-encoding gradient; and
      spatial response function data comprising spatial response functions of gradient coils used to apply the at least one motion-encoding data;
   (c) computing gradient nonlinearity corrected displacement data from the motion-encoded magnetic resonance data using the gradient waveform data and the spatial response function data; and
   (d) generating an image that depicts mechanical properties of the subject from the gradient nonlinearity corrected displacement data.

2. The method as recited in claim 1, wherein step (c) includes forming a displacement vector from phase information contained in the motion-encoded magnetic resonance data and computing the gradient nonlinearity corrected displacement data using the gradient waveform data and the spatial response function data.

3. The method as recited in claim 2, wherein the displacement vector is formed from phase information contained in a subset of the motion-encoded magnetic resonance data.

4. The method as recited in claim 1, wherein step (c) includes computing a Fourier transform of the gradient waveform evaluated at a spatial frequency of the motion-encoding gradient and computing the gradient nonlinearity corrected displacement data from the motion-encoded magnetic resonance data using the Fourier transform of the gradient waveform data and the spatial response function data.

5. The method as recited in claim 1, wherein the gradient nonlinearity corrected displacement data comprise gradient nonlinearity corrected harmonic displacement data.

6. The method as recited in claim 1, wherein the gradient nonlinearity corrected displacement data are computed from an ensemble of the motion-encoded magnetic resonance data using the gradient waveform data and the spatial response function data.

7. The method as recited in claim 1, wherein the gradient nonlinearity corrected displacement data comprise gradient nonlinearity-corrected displacement images generated by:
   factoring the motion-encoded magnetic resonance data into a plurality of subsets, wherein each subset contains motion-encoded magnetic resonance data acquired using a different amplitude of motion encoding;
   reconstructing a plurality of displacement images, each displacement image being reconstructed from a different one of the plurality of subsets; and
   correcting the plurality of displacement images for gradient nonlinearity using the gradient waveform data and the spatial response function data.

8. The method as recited in claim 1, wherein the pulse sequence used to acquire the motion-encoded magnetic resonance data implements the at least one motion-encoding gradient in a monodirectional motion encoding scheme.

9. The method as recited in claim 1, wherein the pulse sequence used to acquire the motion-encoded magnetic resonance data implements the at least one motion-encoding gradient in a tetrahedral motion encoding scheme.

10. The method as recited in claim 9, wherein the tetrahedral motion encoding scheme is a Hadamard motion encoding scheme.

11. The method as recited in claim 1, wherein the pulse sequence used to acquire the motion-encoded magnetic resonance data implements the at least one motion-encoding gradient in a sample interval modulation (SLIM) motion encoding scheme.

12. The method as recited in claim 1, wherein the pulse sequence used to acquire the motion-encoded magnetic resonance data includes at least one first gradient moment nulled motion-encoding gradient.

13. The method as recited in claim 1, wherein the image that depicts mechanical properties of the subject depicts at least one of stiffness, storage modulus, loss modulus, damping ratio, and poroelastic parameters.

14. The method as recited in claim 1, wherein the gradient nonlinearity corrected displacement data are computed based in part on a Taylor series expansion of the spatial response function data.

15. The method as recited in claim 1, wherein the gradient nonlinearity corrected displacement data are computed based in part on a Chebyshev polynomial expansion of the spatial response function data.

16. The method as recited in claim 1, wherein the gradient nonlinearity corrected displacement data are computed and the image that depicts mechanical properties of the subject is generated by inputting the motion-encoded magnetic resonance data, the gradient waveform data, and the spatial response function data to an iterative model-based estimation algorithm, generating output as the image that depicts mechanical properties of the subject.

* * * * *